(12) United States Patent
Lee

(10) Patent No.: US 7,888,764 B2
(45) Date of Patent: Feb. 15, 2011

(54) THREE-DIMENSIONAL INTEGRATED CIRCUIT STRUCTURE

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 1014 days.

(21) Appl. No.: 11/606,523

(22) Filed: Nov. 30, 2006

(65) Prior Publication Data

US 2007/0077694 A1 Apr. 5, 2007

Related U.S. Application Data

(60) Continuation-in-part of application No. 11/378,059, filed on Mar. 17, 2006, which is a division of application No. 10/873,969, filed on Jun. 21, 2004, now Pat. No. 7,052,941.

(30) Foreign Application Priority Data

Jun. 24, 2003 (KR) .................. 10-2003-0040920
Jul. 12, 2003 (KR) .................. 10-2003-0047515

(51) Int. Cl.
 *H01L 31/06* (2006.01)
(52) U.S. Cl. .................. 257/461; 257/46; 257/544
(58) Field of Classification Search ............ 257/44, 257/46, 104, 279, 367, 373, 461, 544, 653
See application file for complete search history.

(56) References Cited

U.S. PATENT DOCUMENTS

| 5,324,980 | A  | * | 6/1994  | Kusunoki ............... 257/74 |
| 5,563,084 | A  | * | 10/1996 | Ramm et al. ............ 438/15 |
| 6,849,891 | B1 | * | 2/2005  | Hsu et al. .............. 257/296 |
| 6,943,067 | B2 |   | 9/2005  | Greenlaw |
| 2004/0012016 | A1 | * | 1/2004  | Underwood et al. ...... 257/40 |
| 2007/0145514 | A1 | * | 6/2007  | Kocon .................... 257/488 |
| 2008/0017906 | A1 | * | 1/2008  | Pelella et al. ........... 257/306 |

* cited by examiner

*Primary Examiner*—Thao P. Le
(74) *Attorney, Agent, or Firm*—Schmeiser Olsen & Watts LLP

(57) ABSTRACT

A semiconductor structure includes an interconnect region and a semiconductor stack bonded to the interconnect region through a bonding region. The stack includes at least two semiconductor layers having different electrical properties. The stack also includes single crystalline semiconductor material. The stack can be processed to form a mesa structure and the mesa structure can be processed to from a vertically oriented semiconductor device.

12 Claims, 6 Drawing Sheets

THREE-DIMENSIONAL INTEGRATED CIRCUIT STRUCTURE

This application is a continuation in part of U.S. patent application Ser. No. 11/378,059 filed on Mar. 17, 2006, which is a divisional of U.S. patent application Ser. No. 10/873,969 filed on Jun. 21, 2004, and is now U.S. Pat. No. 7,052,941, and claims the benefit of both prior applications. This application also claims benefit to prior U.S. patent application Ser. No. 10/934,270 filed on Sep. 3, 2004, Ser. No. 11/092,521 filed on Mar. 29, 2005, Ser. No. 11/092,501 filed on Mar. 29, 2005, Ser. No. 11/092,499 filed on Mar. 29, 2005, Ser. No. 11/092,500 filed on Mar. 29, 2005, Ser. No. 11/092,498 filed on Mar. 29, 2005, and Ser. No. 11/180,286 filed on Jul. 12, 2005. All of these applications are incorporated herein by reference.

BACKGROUND OF THE INVENTION

1. Field of the Invention

The present invention relates generally to semiconductors and, more particularly, to forming circuitry using wafer bonding.

2. Description of the Related Art

Advances in semiconductor manufacturing technology have provided computer chips with integrated circuits that include many millions of active and passive electronic devices, along with the interconnects to provide the desired circuit connections. As is well-known, most integrated circuits include laterally oriented active and passive electronic devices carried on a single major surface of a substrate. Active devices typically include transistors and passive devices typically include resistors, capacitors, and inductors. However, these laterally oriented devices consume significant amounts of chip area.

It is desirable to provide computer chips that can operate faster so they can process more data in a given amount of time. The speed of operation of a computer chip is typically measured in the number of instructions per second it can perform. Computer chips can be made to process more data in a given amount of time in several ways. In one way, the number of devices included is increased so it operates faster because more information is processed in a given period of time. For example, if one computer chip operates on 32-bit data, then another that operates on 64-bit data processes information twice as fast because it performs more instructions per second. However, the 64-bit computer chip will need more devices since there are more bits to process at a given time.

The number of devices can be increased by making the devices included therein smaller, but this requires advances in lithography and increasingly expensive manufacturing equipment. The number of devices can also be increased by keeping their size the same and increasing the area of the computer chip. However, the yield of the computer chips fabricated in a run decreases as their area increases. This increases the overall cost.

Computer chips can also be made faster by decreasing the time it takes to perform certain tasks, such as storing and retrieving information to and from memory. The time needed to store and retrieve information can be decreased by embedding the memory with the computer chip on the same surface as the other devices, as is done with cache memory. However, there are several problems with this.

One problem is that the masks used to fabricate the memory devices are not compatible with the masks used to fabricate the other electronic devices. Hence, it is more complex and expensive to fabricate a computer chip with memory embedded in this way. Another problem is that memory devices tend to be large and occupy a significant amount of area. Hence, if most of the area on the computer chip is occupied by memory devices, there is less area for the other devices. The total area of the computer chip can be increased, but as discussed above, this decreases the yield and increases the cost.

SUMMARY OF THE INVENTION

The present invention employs a semiconductor structure having pieces that are bonded together. One piece includes an interconnect region having a conductive line extending through it. The other piece includes support and multiple layer structures. The multiple layer structure includes at least two layers having different electrical properties, such as a pn junction, pp+ junction, nn− junction, etc.

The two pieces are bonded together through a bonding region and the support structure is removed so that the multiple layer structure is carried by the interconnect region. The bonding region generally includes a metal-to-semiconductor bond or a metal-to-metal bond and the support structure can be removed by grinding through it. The multiple layer structure can be processed further to form a mesa structure connected to the conductive line. The mesa structure can be processed further to form a vertically oriented semiconductor device.

These and other features, aspects, and advantages of the present invention will become better understood with reference to the following drawings, description, and claims.

DETAILED DESCRIPTION OF THE INVENTION

A semiconductor structure is disclosed for use with an electronic circuit in a computer chip. In accordance with the invention, the structure is bonded to an interconnect region and processed to form vertically oriented semiconductor devices that are positioned above the electronic circuit. The vertical devices are in communication with the electronic circuit through conductive lines extending through the interconnect region.

The invention provides several advantages, with one being that the vertical devices can replace corresponding lateral ones positioned on the same surface of the electronic circuit, as is usually done with cache memory. Replacing the horizontal devices with vertical ones is advantageous because this provides more area for the electronic circuit since the vertical devices are positioned above it instead of on the same surface. In this way, the electronic circuit can include more electronic devices without increasing the chip area. Further, more vertical devices can be included because they generally occupy less area than horizontal devices. For example, a vertical memory device occupies less area than a corresponding horizontal memory device.

Another advantage of the semiconductor structure is that the vertical devices are positioned closer to the electronic circuit so signals flow between them in less time. This allows the computer chip to operate faster. Still another advantage is that the electronic circuit can be fabricated with a different mask set than the vertical devices. This allows them to be formed separately so the masks are less complicated and less expensive to make. A further advantage is that the vertical devices are fabricated from blanket semiconductor layers after they have been bonded to the interconnect region. If the vertical devices are formed before they are bonded, they need to be aligned with the electronic circuit. Avoiding this alignment step is desirable because it is complicated and expensive. This is especially true as the vertical devices and the devices included in the electronic circuit become smaller.

Figure 1A:
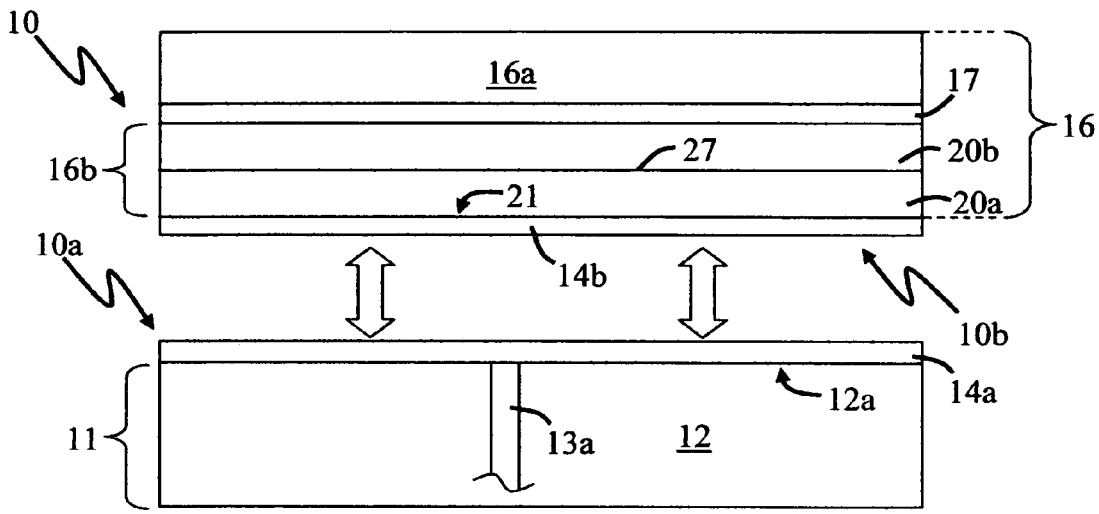
FIGS. 1a, 1b and 1c are side views showing steps in one embodiment of processing a semiconductor structure, in accordance with the invention, to form a mesa structure.
Figure 1B:
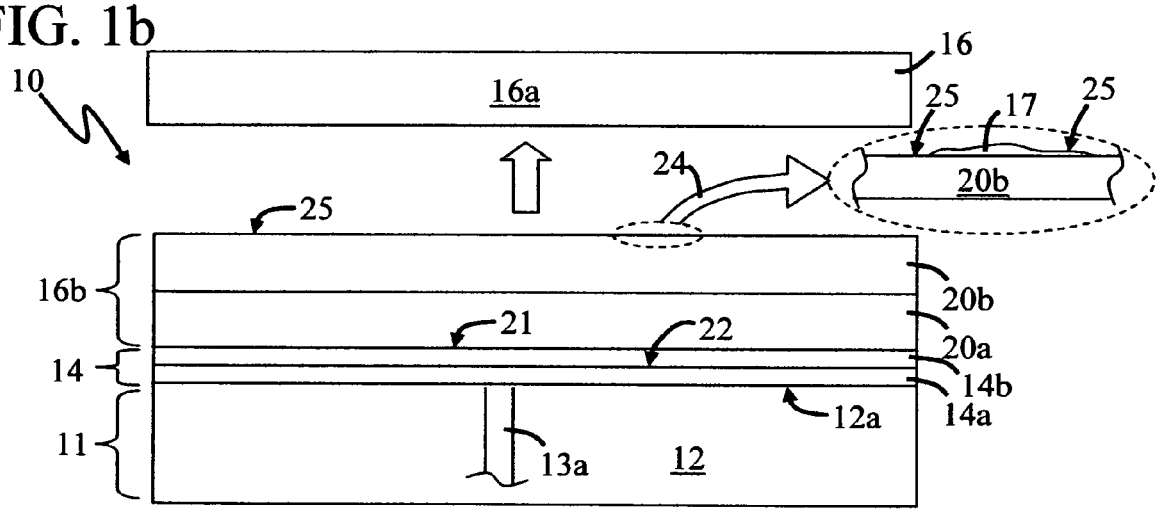
Figure 1C:
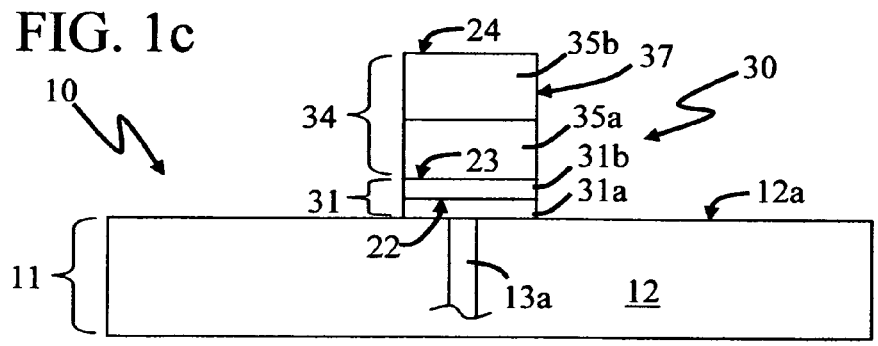

FIGS. 1a, 1b and 1c are side views showing steps in one embodiment of processing a semiconductor structure 10, in accordance with the invention. In this embodiment, structure 10 includes pieces 10a and 10b (FIG. 1a) which are processed to form a mesa structure 30 (FIG. 1c). It should be noted that pieces 10a and 10b, or portions thereof, can be provided prefabricated or fabricated as described below. Further, the formation of one mesa structure 30 is shown here for simplicity and ease of discussion, but a number of mesa structures are generally formed in an array of such structures.

In this embodiment, piece 10a includes an interconnect region 11 having a conductive line 13a extending through a dielectric region 12. Piece 10b includes a substrate 16 having a support structure 16a coupled to a multiple layer structure 16b through a detach region 17. Detach region 17 has a weaker mechanical strength relative to support structure 16a and multiple layer structure 16b. The mechanical strength of region 17 is sufficient enough at this step in the process to hold structures 16a and 16b together, but weak enough so they can be decoupled from each other during a subsequent step. Region 17 and structure 16b can be formed separately from substrate 16, but in this embodiment they are portions of it.

Detach region 17 can include many different materials, such as oxide or porous semiconductor materials, and can be formed in many different ways. In one embodiment, detach region 17 is a portion of substrate 16 that is formed by implanting a material therein using what is typically referred to as ion implantation. Here, the implanted material includes material implanted through a surface 21 of substrate 16. In this way, detach region 17 extends through substrate 16 and below surface 21.

Detach region 17 can be formed by implanting many different materials, such as ions from an inert gas like argon, neon, etc. The preferred gas, however, includes hydrogen so region 17 includes implanted hydrogen. The implanted material increases the amount of damage in detach region 17 and, consequently, reduces its mechanical strength relative to structures 16a and 16b. As will be discussed below, this is useful so a cleave can be formed through detach region 17 to provide a cleavage plane extending through substrate 16. The cleavage plane allows structures 16a and 16b to be decoupled from each other, as discussed in more detail with FIG. 1b.

Multiple layer structure 16b is a portion of piece 10a that includes multiple semiconductor layers. In this particular example, the multiple layers include a semiconductor layer 20b positioned adjacent to detach region 17 and a semiconductor layer 20a positioned adjacent to layer 20b. Layers 20a and 20b can be formed in many different ways, such as with implantation and diffusion doping, although implantation is preferred. It should be noted that detach region 17 is generally formed before structure 16b, but it can be formed afterwards in some examples by implanting through structure 16b.

In accordance with the invention, at least two semiconductor layers in structure 16b have different electrical properties. The electrical properties can be characterized in many different ways, such as conductivity type, doping concentration, composition, and/or band gap energy. Some layers in structure 16b can also be nominally undoped which means they include impurities unintentionally incorporated with them during growth. Undoped semiconductor layers are often referred to as being intrinsically doped. In this particular example, layers 20a and 20b are p-type and n-type, respectively, so they have opposite conductivity types. In this way, there is a pn junction formed with them proximate to an interface 27.

Figure 3A:
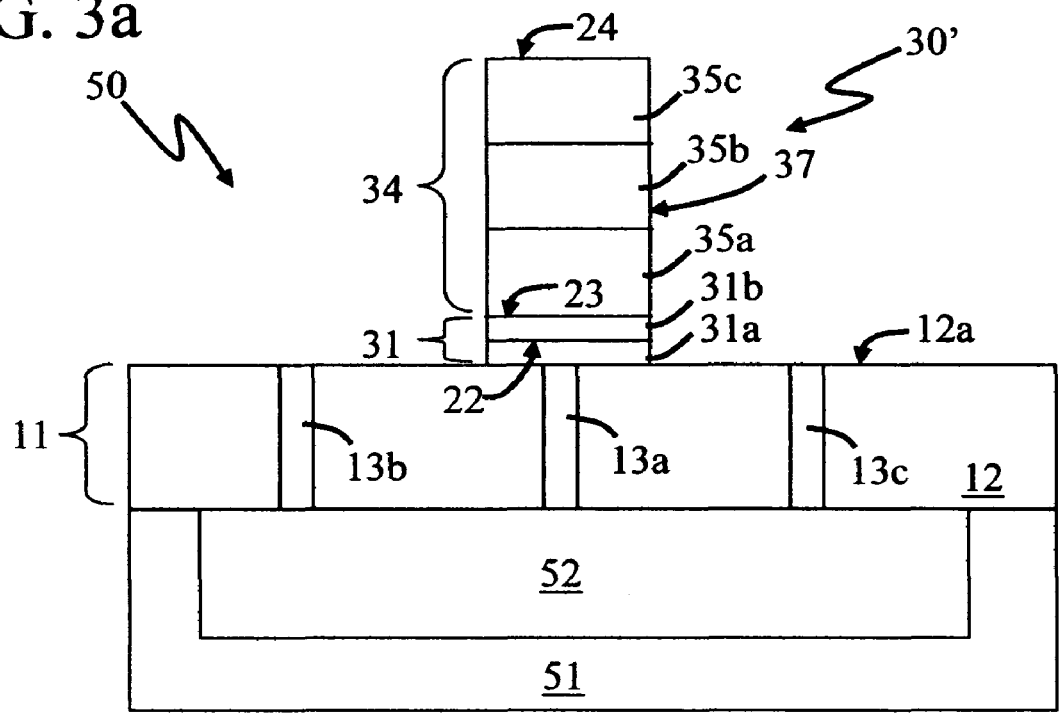
FIGS. 3a and 3b are side views showing steps in one embodiment of processing a semiconductor structure to fabricate a vertically oriented semiconductor device, in accordance with the invention.
Figure 3B:
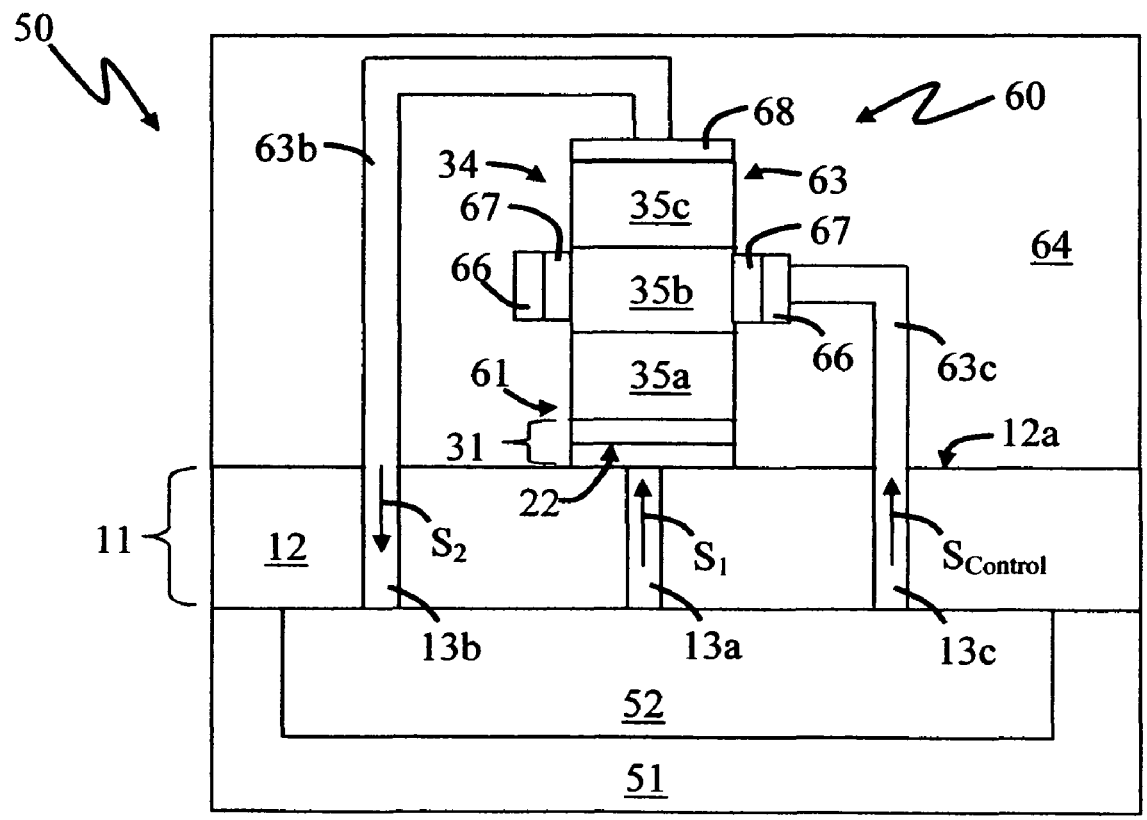

Multiple layer structure 16b can include more than two semiconductor layers. For example, structure 16b can include pnp, npn, npnp, pnpn, nn$^+$pp+, nn$^+$p, and p$^-$pn layer structures, among others. The layer structure will depend on the vertical device it is desired to form with layer structure 16b. For example, a diode, transistor and thyristor generally include a layer structure with two, three and four layers, respectively. An example of a three layer stack for forming a transistor is shown in FIGS. 3a and 3b.

In some embodiments, vertical devices can even be stacked on top of each other. For example, a layer structure can include three layers for a transistor and four layers for a thyristor so the layer structure includes seven layers. In some of these examples, a layer between the stacked vertical devices can be shared. For example, the transistor and thyristor can share a layer so the layer structure includes six layers instead of seven.

In general, however, multiple layer structure 16b includes two or more semiconductor layers having different electrical properties so there is an interface between them. In this example, an interface 27 is between layers 20a and 20b and the current flow through interface 27 is substantially perpendicular to surface 21 when structure 16b is used to form an electronic device. It should be noted that interface 27 is generally curved since it is formed by ion implantation and/or diffusion doping. However, here it is shown for simplicity as being straight and extending parallel to surface 21.

In accordance with the invention, a conductive bonding layer 14a is carried on a surface 12a of region 11 so it is connected to conductive line 13a. Further, a conductive bonding layer 14b is positioned on surface 21. In some embodiments, surface 21 is planarized before layer 14b is positioned on it. The planarization can be done in many different ways, such as by chemical mechanical polishing and wet etching. It should be noted that chemical mechanical polishing generally involves grinding through a material region and is sometimes referred to as lapping.

Pieces 10a and 10b can include many different types of materials. Dielectric region 12 includes an insulative material, which is preferably silicon oxide. This is because silicon oxide is compatible with silicon processing technology. In other examples, region 12 can include other insulative materials, such as aluminum nitride and silicon nitride. Substrate 16 preferably includes silicon for several reasons. For example, silicon is inexpensive, readily available and compatible with silicon oxide. Further, the device subsequently formed with layer structure 16b is silicon based, as will be discussed below. Silicon is also preferable because it is currently used for most electronic circuits, such as digital and analog circuitry. Another material that region 16 can include is gallium arsenide, which is preferred for high speed devices, such as high frequency amplifiers. Indium phosphide, gallium nitride and silicon carbide are generally preferred for high power devices, such as transistors. Silicon germanium has a lower band gap energy than silicon, but it can be used for some of the same devices, such as transistors.

In this embodiment, structure 16b includes crystalline semiconductor material, but it can also include amorphous and/or polycrystalline material in addition to crystalline material. The crystalline semiconductor material is preferably single crystal semiconductor material because it has fewer defects and, consequently, devices made with it operate better. For example, the leakage current of the device is less because single crystal semiconductor material has fewer defects.

Conductive line 13a and conductive bonding layers 14a and 14b can include many different conductive materials, but they preferably include aluminum because it has a low melting temperature so it can be formed at a low temperature. This is desirable because it reduces the degradation of the electrical properties of semiconductor structure 10, as discussed in more detail below. In other examples, conductive line 13a and layers 14a and 14b can include conductive materials, such as silver, gold, copper, and platinum. Other suitable conductive materials include refractory metals such as tantalum, molybdenum, and tungsten. The conductive material can also include polycrystalline semiconductor materials.

In accordance with the invention, and as indicated by the movement arrows in FIG. 1a, conductive bonding layers 14a and 14b are bonded together to form a bonding interface 22 in a bonding region 14, as shown in FIG. 1b. Bonding region 14 includes conductive layers 14a and 14b and bonding interface 22 is between them so it is a metal bonding interface. Other embodiments of bonding regions are discussed with FIGS. 2a-2c below.

Bonding interface 22 can be formed in many different ways. In one way, conductive layer 14a is brought into contact with conductive layer 14b at a bonding temperature sufficient to provide a bond between them so bonding interface 22 is formed. In this way, surface 21 is bonded to interconnect region 11 through bonding interface 22 and pieces 10a and 10b are bonded together. In another way, layers 14a and 14b are brought into contact with each other and then provided with a bonding temperature sufficient to provide a bond between them so bonding interface 22 is formed.

It should be noted that the strength of the bond between conductive bonding layers 14a and 14b depends substantially on the material included in them and the bonding temperature. The bonding temperature is chosen to provide a strong enough bond to hold pieces 10a and 10b together and is preferably in a range from about 250° C. to about 700° C. The bonding temperature is also chosen to reduce the degradation of other regions of semiconductor structure 10, such as multiple layer structure 16b and conductive line 13a. It is known that the properties of materials generally degrade as their temperature increases. For example, in conventional CMOS processes at BEOL (Back-End OF the Line), it is useful to bond at a temperature below about 500° C. to reduce the amount of degradation of the materials included therein.

It should also be noted that semiconductor layers 20a and 20b are typically formed before conductive layer 14b is deposited on surface 21. For example, if layers 20a and 20b are formed by diffusion doping, then this is generally done before layer 14b is deposited on surface 21. However, if layers 20a and/or 20b are formed by ion implantation, then this can be done before or after layer 14b is deposited on surface 21. If the implantation is done afterwards, then material from conductive layer 14b can be moved into structure 16b. This can decrease the electrical resistance between layer 14b and structure 16b.

Figure 2A:
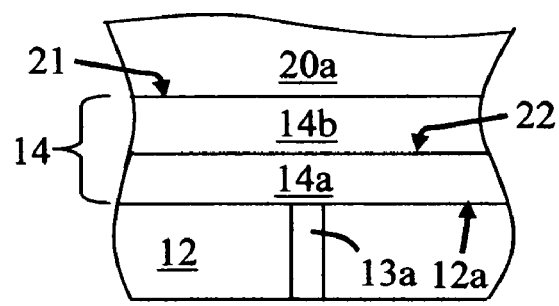
FIGS. 2a, 2b and 2c are partial side views showing different embodiments of bonding regions that can be included in the structures of FIGS. 1b and 1c.
Figure 2B:
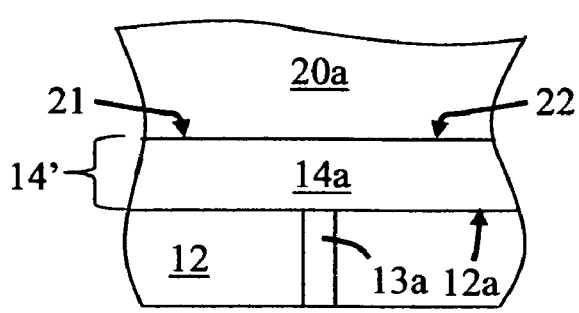
Figure 2C:
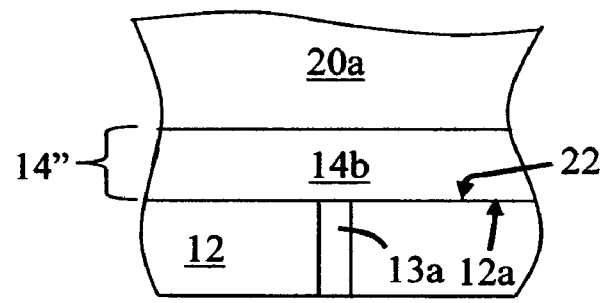

FIGS. 2a, 2b and 2c are partial side views showing different embodiments of bonding regions, in accordance with the invention. FIG. 2a corresponds to bonding region 14 as shown in FIG. 1c where it includes metal layers 14a and 14b with bonding interface 22 between them. FIGS. 2b and 2c correspond to bonding regions 14' and 14", respectively. Bonding region 14' includes metal layer 14a so the bonding is between metal layer 14a and semiconductor layer 20a. Bonding interface 22 includes surface 21 so the bond is a metal-semiconductor bond. In one particular example, the semiconductor is silicon, so the bond is a metal-to-silicon bond. Bonding region 14" includes metal layer 14b so the bonding is between metal layer 14b and dielectric material 12. Bonding interface 22 includes surface 12a so the bond is a metal-insulator bond.

As shown in FIG. 1b and in accordance with the invention, support structure 16a is decoupled from multilayer structure 16b so structure 16b is carried by interconnect region 11. Structure 16a can be decoupled from structure 16b in many different ways. In one embodiment, structures 16a and 16b are decoupled from each other by grinding through region 16a to detach region 17. The grinding can be done in many different ways, such as chemical mechanical polishing. In another embodiment, structures 16a and 16b are decoupled from each other by cleaving through detach region 17 to form a cleaved surface 25, which is opposed to surface 21. Cleaved surface 25 can be defined by structure 16b and/or portions of region 17 still attached to structure 16b after cleaving, as shown by substitution arrow 24. In some cleaving embodiments, surface 25 is planarized to form a planarized surface 24 (FIG. 1c) and to remove the portions of detach region 17 still attached to structure 16b. In some examples, the planarization can take place such that surface 24 extends into structure 16b. This ensures that all of detach region 17 is removed from multiple layer structure 16b.

It should be noted that the surface roughness of a planarized surface is less than the surface roughness of a non-planarized surface. An example of a non-planarized surface is a cleaved surface. The surface roughness can be determined in many different ways, such as by using a profilometer or an optical interferometer. The planarization can be done in many different ways, such as those discussed above with surface 21. If desired, structure 10, as shown in FIG. 1b, can be processed further. In one embodiment, multiple layer structure 16b is processed to form mesa structure 30, as will be discussed in more detail presently.

In accordance with the invention, structure 16b is selectively etched to surface 12a of interconnect region 11 to form mesa structure 30, as shown in FIG. 1c. Mesa structure 30 includes a conductive contact 31a positioned on surface 12a and a conductive contact 31b positioned on contact 31a. Conductive contacts 31a and 31b form a bonding region 31 having bonding interface 22 and correspond to portions of metal layers 14a and 14b, respectively, that have not been etched away. Bonding region 31 couples mesa structure 30 to interconnect region 11 through bonding interface 22 and is conductive so signals can flow through it. Mesa structure 30 also includes a semiconductor stack 34 with a semiconductor layer 35a positioned on contact 31b and a semiconductor layer 35b positioned on layer 35a. Stack 34, layer 35a, and layer 35b are portions of structure 16b, layer 20a, and layer 20b, respectively, that have not been etched away when processing structure 10 as shown in FIG. 1b.

The etching can be done in many different ways, such as with wet and dry etching. The etching is selective so conductive line 13a is connected to mesa structure 30 through bonding region 30 and bonding interface 22. This can be done in many different ways, such as by using a mask aligned with conductive line 13a.

The etching is done so mesa structure 30 includes planarized surfaces 23 and 24 and has a sidewall 37 extending between them. In this example, sidewall 37 is straight and substantially perpendicular to bonding interface 22. However, in other examples, sidewall 37 can be curved and/or at an angle relative to bonding interface 22. It should be noted that, from a top view, mesa structure 30 can have many different shapes, such as rectangular, square and circular. If desired, mesa structure 30, or the array of mesa structures, can be processed further to form one or more vertically oriented semiconductor devices.

An electronic device formed with mesa structure 30 will operate as a diode since semiconductor stack 34 includes one pn junction. The diode is formed by forming another conductive line connected to surface 24 so a signal can be flowed through it, stack 34 and conductive line 13a. However, these details are left out of FIG. 1c for simplicity. In other examples, stack 34 includes more than two semiconductor layers. In these examples, a control terminal is typically positioned near sidewall 37 so it can adjust the conductivity of one or more of the layers included in stack 34 in response to a signal. The details of one such device will be discussed presently.

FIGS. 3a and 3b are side views showing steps in one embodiment of processing a semiconductor structure 50 to fabricate a vertically oriented semiconductor device 60 (FIG. 3b), in accordance with the invention. It should be noted that some of the steps implemented in processing structure 50 to fabricate device 60 are the same or similar to those discussed above with FIGS. 1a-1c.

In this embodiment, structure 50 includes a substrate 51, which can include many different materials such as those discussed above with substrate 16. Substrate 51 carries an electronic circuit 52, which can be of many different types. Here, it preferably includes silicon-based digital logic circuitry used to control the operation of device 60, as will be discussed in more detail below.

Substrate 51 carries interconnect region 11, which includes conductive line 13a, as well as conductive lines 13b and 13c. Conductive lines 13a, 13b and 13c are connected to circuit 52 and extend upwardly therefrom and through dielectric region 12. Interconnect region 11 carries a mesa structure 30' on bonding region 31. Structure 30' is formed from a multiple layer structure, such as structure 16b of FIG. 1b, and includes stack 34 having three semiconductor layers instead of two. At least one of the layers in stack 34 has electrical properties different from the others.

In this embodiment, the three layers in stack 34 are denoted as semiconductor layers 35a, 35b, and 35c. Layers 35a, 35b, and 35c can include many different types of semiconductor materials, such as those discussed above with FIGS. 1a-1c, but here they include silicon. In this example, layer 35a is doped n-type, layer 35b is doped p-type, and layer 35c is doped p-type so that device 60 can be formed into a vertically oriented MOSFET, as will be discussed in more detail below.

In FIG. 3b, device 60 has an end 61 coupled to interconnect region 11 through bonding region 31 and an opposed end 63 away from bonding region 31. Bonding region 31 is connected to electronic circuit 52 through conductive line 13a. In this way, end 61 is in communication with electronic circuit 52 and signals can flow between them. A conductive contact 68 is positioned on surface 24 and a conductive line 63b is formed which extends between contact 68 and conductive line 13b. In this way, end 63 is in communication with electronic circuit 52 and signals can flow between them.

In this embodiment, a dielectric region 67 is positioned around semiconductor stack 34 and a control terminal 66 is positioned around dielectric region 67. Control terminal 66 is connected to conductive line 13c through a conductive line 63c. In this way, control terminal 66 is in communication with electronic circuit 52 and signals can flow between them.

In accordance with the invention, electronic circuit 52 flows one or more signals between it and vertically oriented semiconductor device 60 through interconnect region 11. The operation of device 60 can be controlled in many different ways in response to these signals. In one mode of operation, the conductivity of one or more layers in semiconductor stack 34 is adjusted in response to a control signal $S_{Control}$ flowed between circuit 52 and control terminal 66 through conductive lines 13c and 63c. An electric field between control terminal 66 and semiconductor stack 34 is provided through dielectric region 67 in response to $S_{Control}$. This electric field modulates the conductivity of semiconductor stack 34. The conductivity can be modulated so a depletion or inversion region extends through stack 34 substantially parallel to bonding interface 22. The depletion or inversion region also extends from the outer periphery of semiconductor stack 34 towards its center because dielectric region 67 and control terminal 66 surround stack 34 on sidewall 37.

In a second mode of operation, electronic circuit 52 provides a signal $S_1$ through conductive line 13a which flows through bonding region 31 and bonding interface 22. Signal $S_1$ flows through semiconductor stack 34 to end 63 where it is outputted as signal $S_2$. Signal $S_2$ flows through metal layer 68 to conductive line 63b and to circuit 52 to complete the circuit. In this way, the current flow through semiconductor stack 34 is substantially perpendicular to bonding interface 22.

It should be noted that signal $S_2$ corresponds to a scaled version of signal $S_1$. In this way, signal $S_2$ can be the same as signal $S_1$, or it can be an attenuated or amplified version of it. It should also be noted that the flow of signals $S_1$ and $S_2$ can be reversed in other examples.

In another mode of operation, device 60 operates as a MOSFET. In this mode, signal $S_1$ flows as described above and control signal $S_{Control}$ provides semiconductor stack 34 with a desired conductivity. The desired conductivity is chosen so that signal $S_1$ is scaled as it flows through semiconductor stack 34 and is outputted as signal $S_2$. In this way, signal $S_1$ is scaled after it flows through bonding interface 22. It should be noted that the flow of signals $S_1$ and $S_2$ can be reversed in some examples so that signal $S_1$ is scaled before it flows through bonding interface 22.

Figure 4A:
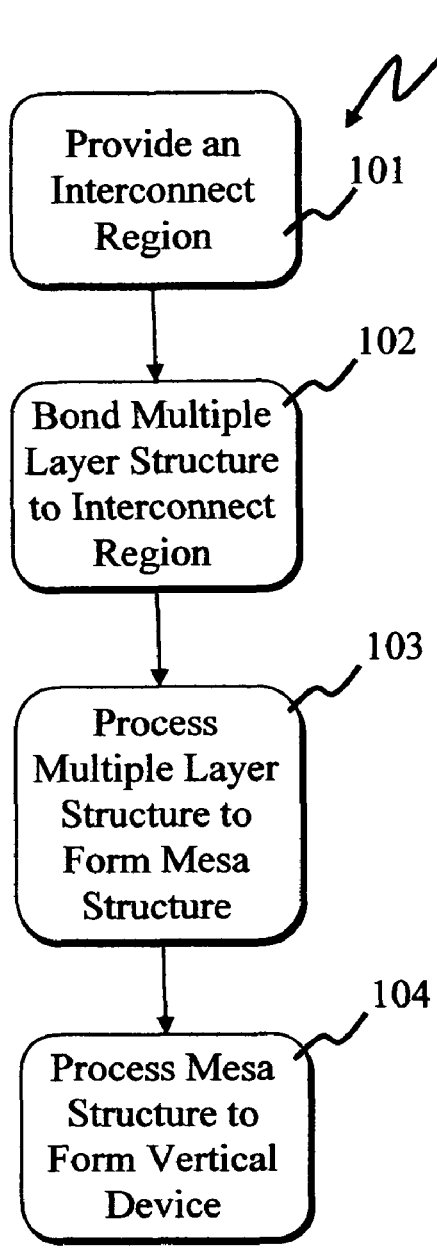
FIGS. 4a, 4b and 4c are flowcharts of methods of fabricating a semiconductor structure, in accordance with the invention.

FIG. 4a is a flowchart of a method 100 of fabricating a semiconductor structure, in accordance with the invention. In one embodiment, method 100 includes a step 101 of providing an interconnect region. In some embodiments, the interconnect region is carried by an electronic circuit. Method 100 also includes a step 102 of bonding a multiple layer structure to the interconnect region with a bonding region.

In accordance with the invention, step 102 includes forming a bonding interface. The bonding interface is generally formed between two conductive bonding layers included in the bonding region and positioned between the multiple layer structure and interconnect region. The two conductive bonding layers preferably include metals, so the bonding interface is a metal-to-metal bonding interface. The metals can be the same or different, with a preferred metal being aluminum.

The conductive bonding layers are heated to a bonding temperature so they bond together.

In other embodiments, the bonding interface is at the interface of the bonding and interconnect regions, so the bond is a metal-insulator bond. A conductive bonding layer in the bonding region and the insulator in the interconnect region are heated to a bonding temperature so they bond together. In still other embodiments, the bonding interface is at the interface of the bonding region and multiple layer structure, so the bond is a metal-semiconductor bond. A conductive bonding layer in the bonding region and the semiconductor in the multiple layer structure are heated to a bonding temperature so they bond together.

In this embodiment, the multiple layer structure includes a stack of semiconductor material layers that can be processed to form a mesa structure. The multiple layer structure, or a portion thereof, preferably includes single crystal semiconductor material. At least two layers in the stack of semiconductor material layers have different electrical properties.

The interconnect region, electronic circuit, and/or multiple layer structure can be provided in many different ways. In one example, the interconnect region, electronic circuit, and/or multiple layer structure, or portions thereof, are prefabricated and provided to a user implementing method 100. In another example, the interconnect region, electronic circuit, and/or multiple layer structure, or portions thereof, are fabricated by the user implementing method 100. In some examples, the multiple layer structure and interconnect region are provided to the user already bonded together. In other examples, they are bonded together by the user.

In some embodiments, method 100 includes a step 103 of processing the multiple layer structure to form the mesa structure. This is generally done after the multiple layer structure is bonded to the interconnect region. The multiple layer structure can be processed in many different ways, such as by wet and dry etching. The dry etching can include chemical mechanical polishing. Step 103 typically includes using a mask to form the mesa structure in alignment with a conductive line extending through the interconnect region. Hence, an end of the multiple layer structure is connected to the conductive line through the bonding region. In this way, the bonding region carries the mesa structure and bonds it to the interconnect region.

In some embodiments, method 100 can also include a step 104 of processing the mesa structure to form a vertically oriented semiconductor device. The vertically oriented semiconductor device is preferably in communication with the electronic circuit through the interconnect region so signals can flow between them. The mesa structure can be processed in many different ways to form the vertically oriented semiconductor device. The processing generally involves forming various conductive lines that extend between the vertically oriented semiconductor device and interconnect region.

In some examples, the processing involves forming a control terminal coupled to a sidewall of the mesa structure. The control terminal allows the conductivity of one or more of the semiconductor layers in the semiconductor stack to be adjusted in response to a control signal provided by the electronic circuit. The control terminal is typically spaced from the sidewall by a dielectric region. In this way, the vertically oriented semiconductor device can be formed to operate as many different electronic devices, such as a transistor, thyristor, etc.

Figure 4B:
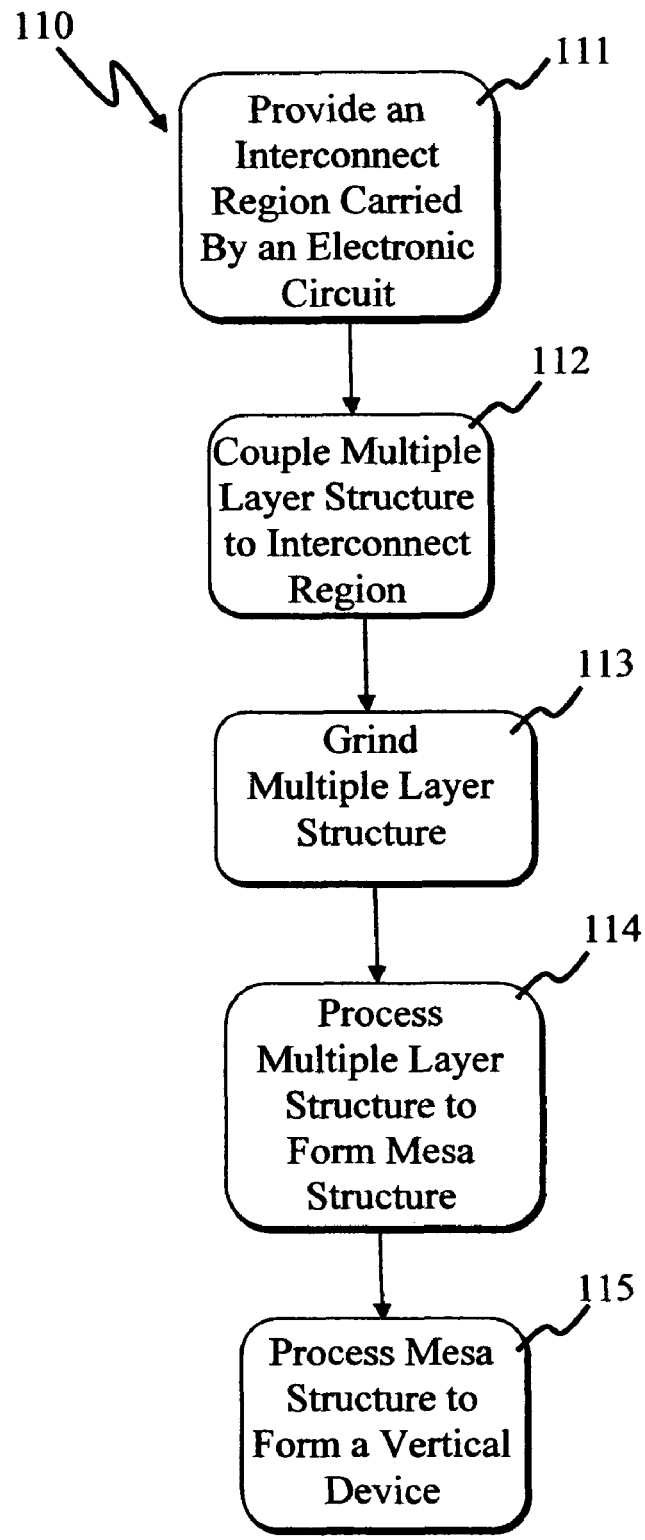

FIG. 4b is a flowchart of a method 110 of fabricating a semiconductor structure, in accordance with the invention. It should be noted that method 110 can include the same or similar steps described above in conjunction with method 100. In one embodiment, method 110 includes a step 111 of providing an interconnect region carried by an electronic circuit and a step 112 of coupling a multiple layer structure to the interconnect region with a bonding region. The interconnect region is generally positioned between the electronic circuit and multiple layer structure. In accordance with the invention, the multiple layer structure is capable of being processed to form a mesa structure which has an end in communication with the electronic circuit through a conductive line extending through the interconnect region.

In some embodiments, method 110 includes a step 113 of grinding the multiple layer structure to reduce its thickness. The multiple layer structure can be ground in many different ways, such as with chemical mechanical polishing. Method 110 can also include a step 114 of processing the multiple layer structure to form the mesa structure. The multiple layer structure is processed so the bonding region couples the mesa structure to the interconnect region and an end of the mesa structure is in communication with the electronic circuit through the bonding region. Method 110 can also include a step 115 of processing the mesa structure to form a vertically oriented semiconductor device.

Figure 4C:
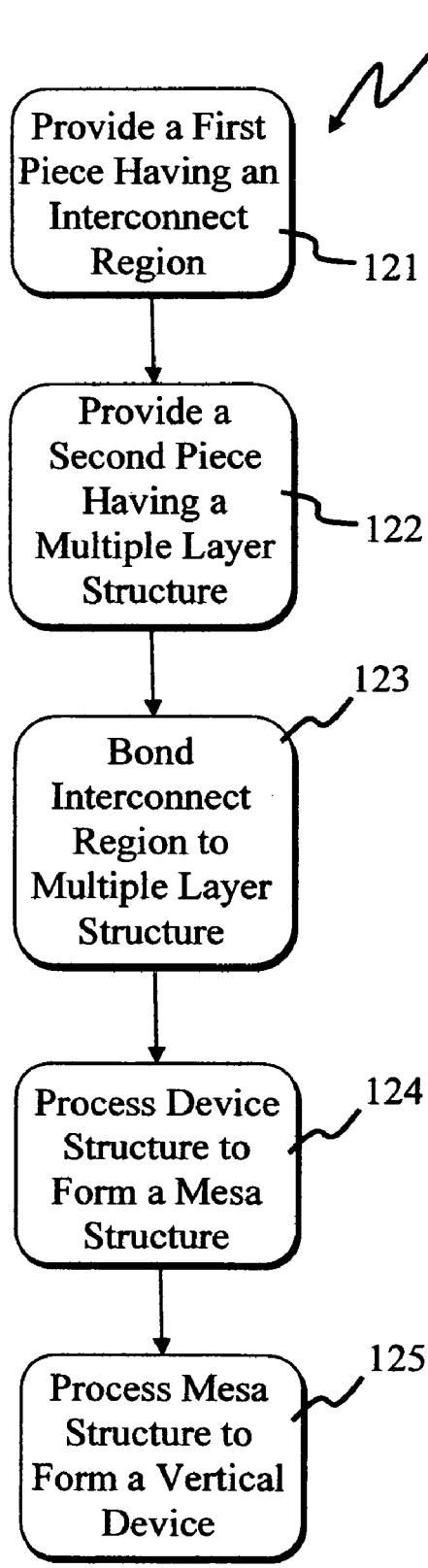

FIG. 4c is a flowchart of a method 120 of fabricating a semiconductor structure, in accordance with the invention. It should be noted that method 120 can include the same or similar steps described above in conjunction with methods 100 and 110. In this embodiment, method 120 includes a step 121 of providing a first piece having a substrate that carries an electronic circuit and interconnect region. Method 120 also includes a step 122 of providing a second piece having a substrate which carries a multiple layer structure. Method 120 further includes a step 123 of bonding the interconnect region and the multiple layer structure together with a bonding region. The first and second pieces, or portions thereof, can be prefabricated or they can be fabricated by the user implementing method 120.

In some embodiments, method 120 includes a step 124 of processing the multiple layer structure to form a mesa structure. Step 124 typically includes aligning a mask with a conductive line extending through the interconnect region so the mesa structure is formed with an end connected to the conductive line through the bonding region. In some embodiments, method 120 includes a step 125 of processing the mesa structure to form a vertically oriented semiconductor device. The vertically oriented semiconductor device is generally connected to the electronic circuit through a conductive line extending through the interconnect region.

The interconnect region includes conductive lines which extend between the vertically oriented semiconductor device and the electronic circuit so an electrical signal can flow between them. In this way, the operation of the vertically oriented semiconductor device can be controlled using the electronic circuit. For example, if the vertically oriented semiconductor device is a memory device, the signal can read information stored by it. The signal can also write information to the memory device so the information is stored. Further, the signal can erase the information stored by the memory device.

Figure 5A:
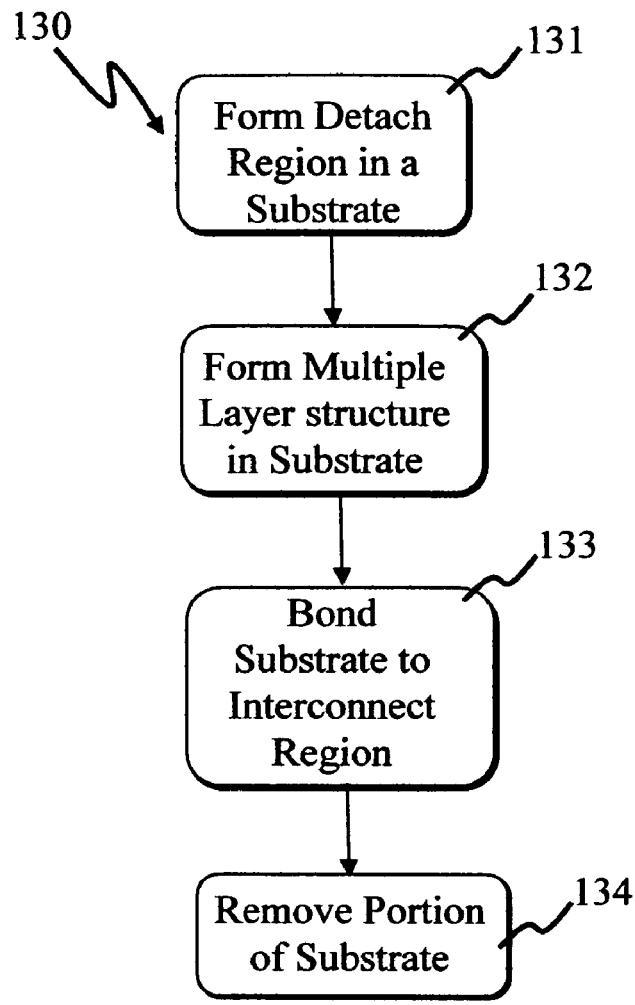
FIGS. 5a, 5b and 5c are flowcharts of methods of fabricating a semiconductor structure, in accordance with the invention.

FIG. 5a is a flowchart of a method 130 of fabricating a semiconductor structure, in accordance with the invention. It should be noted that method 130 can include the same or similar steps described above in conjunction with methods 100, 110, and 120. In this embodiment, method 130 includes a step 131 of forming a detach region below a surface of a substrate and a step 132 of forming a multiple layer structure which extends between the surface of the substrate and detach region. The detach region can be formed in many different ways, but is generally formed by implanting hydrogen into the substrate. In accordance with the invention, step 132 includes fabricating the multiple layer structure so it includes at least two layers having different electrical properties. In other examples, however, the multiple layer structure can be prefabricated.

In some embodiments, method 130 includes a step 133 of bonding the surface of the substrate to an interconnect region. The surface of the substrate is preferably bonded to the interconnect region with a bonding region, which is described above in more detail.

In some embodiments, method 130 includes a step 134 of removing at least a portion of the substrate between the detach region and an opposed surface of the substrate. The portion of the substrate can be removed in many different ways, such as by wet and dry etching. The portion of the substrate is preferably removed by cleaving through the detach region, but it can also be removed by grinding it. In this way, the portion of the substrate is removed and the multiple layer structure is carried by the interconnect region.

Figure 5B:
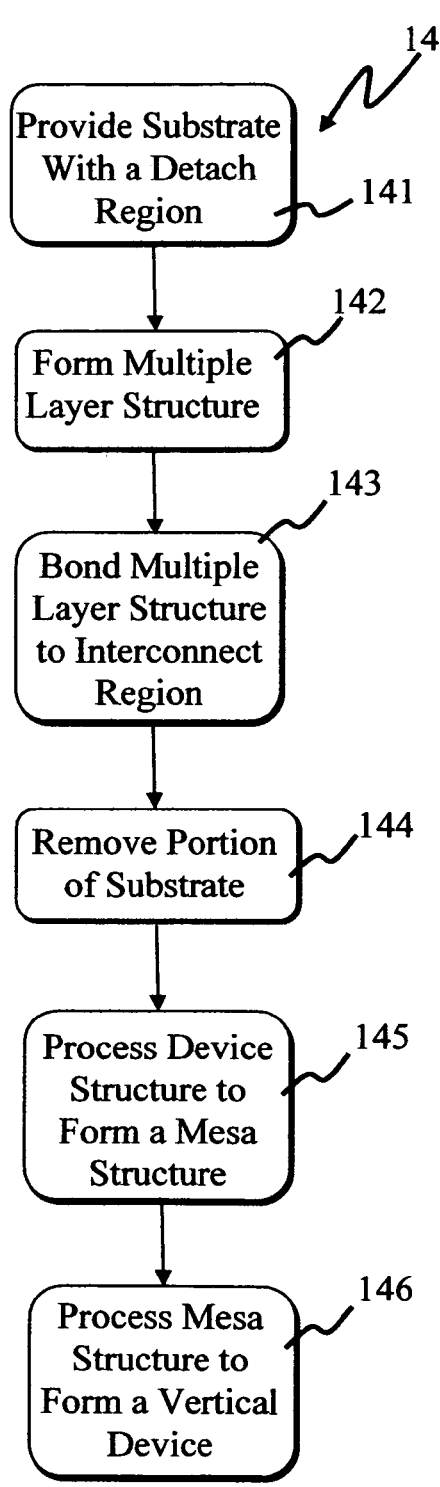

FIG. 5b is a flowchart of a method 140 of fabricating a semiconductor structure, in accordance with the invention. It should be noted that method 140 can include the same or similar steps described above in conjunction with methods 100, 110, 120, and 130. In this embodiment, method 140 includes a step 141 of providing a substrate with a detach region extending below its surface. Method 140 also includes a step 142 of forming a multiple layer structure between the detach region and surface of the substrate. Method 140 further includes a step 143 of bonding the multiple layer structure to an interconnect region. The multiple layer structure is preferably bonded to the interconnect region with a bonding region, as described above.

In some embodiments, method 140 includes a step 144 of removing at least a portion of the substrate between its opposed surface and the detach region. The portion of the substrate can be removed as discussed above. In some embodiments, method 140 also includes a step 145 of processing the multiple layer structure to form a mesa structure. In these embodiments, method 140 can include a step 146 of processing the mesa structure to form a vertically oriented semiconductor device. The vertically oriented semiconductor device is usually in communication with an electronic circuit through the interconnect region.

Figure 5C:
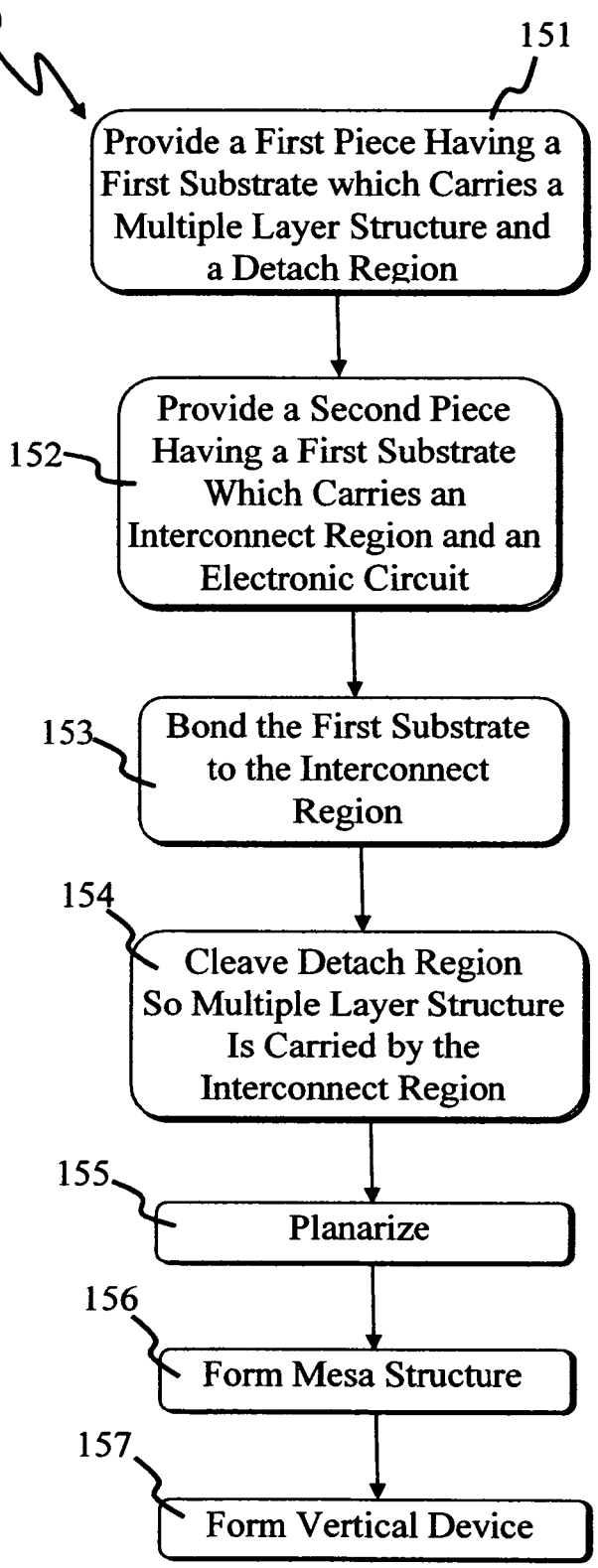

FIG. 5c is a flowchart of a method 150 of fabricating a semiconductor structure, in accordance with the invention. It should be noted that method 150 can include the same or similar steps described above in conjunction with methods 100, 110, 120, 130, and 140. In this embodiment, method 150 includes a step 151 of providing a first piece having a first substrate with a multiple layer structure between its surface and a detach region extending below the surface of the substrate. The multiple layer structure preferably includes a stack of semiconductor material layers, with at least two of the layers having different electrical properties.

Method 150 also includes a step 152 of providing a second piece having a second substrate which carries an electronic circuit and interconnect region. It should be noted that the first and/or second pieces can be fabricated by the user implementing method 150 or prefabricated. Method 150 further includes a step 153 of bonding the first substrate to the interconnect region. The bonding is preferably provided by a bonding region positioned between the surface of the first substrate and the interconnect region.

In some embodiments, method 150 includes a step 154 of cleaving the detach region so the multiple layer structure is carried by the interconnect region. Method 150 can also include a step 155 of planarizing an exposed surface of the multiple layer structure after step 154. In some embodiments, method 150 includes a step 156 of forming a mesa structure from the multiple layer structure. In these embodiments, method 150 can include a step 157 of forming a vertically oriented semiconductor device from the mesa structure. The vertically oriented semiconductor device is preferably in communication with the electronic circuit through a conductive line extending through the interconnect region.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. An apparatus, comprising:
   a substrate which carries an electronic circuit and an interconnect region; and
   a vertically oriented semiconductor device bonded to the interconnect region through a bonding region, the semiconductor device including a mesa structure having a pn junction.

2. The apparatus of claim 1, wherein the bonding region includes a metal layer.

3. The apparatus of claim 1, wherein opposed surfaces of the mesa structure include planarized surfaces.

4. The apparatus of claim 1, wherein the interconnect region includes a conductive line, the electronic circuit and vertically oriented semiconductor device being in communication with each other through the conductive line.

5. The apparatus of claim 1, wherein the vertically oriented semiconductor device is operated in response to a signal provided by the electronic circuit.

6. The apparatus of claim 1, wherein the mesa structure includes crystalline semiconductor material.

7. The apparatus of claim 1, wherein the vertically oriented semiconductor device includes a control terminal which adjusts the conductivity of the mesa structure in response to a signal from the electronic circuit.

8. An apparatus, comprising:
   a substrate which carries an electronic circuit and interconnect region; and
   a vertically oriented semiconductor device bonded to the interconnect region through a bonding region, the semiconductor device including a mesa structure having a pn junction and opposed planarized surfaces, wherein the pn junction extends between the opposed planarized surfaces.

9. The apparatus of claim 8, wherein the bonding region includes a metal material.

10. The apparatus of claim 9, wherein the vertically oriented semiconductor device is bonded to the interconnect region through a bonding interface established by the bonding region.

11. The apparatus of claim 10, wherein the bonding interface is not a growth interface.

12. The apparatus of claim 8, wherein the bonding region includes first and second conductive bonding layers with a bonding interface extending therebetween, wherein the electronic circuit is in communication with the vertically oriented semiconductor device through the interconnect region and first and second conductive bonding layers.

* * * * *